United States Patent [19]

Pucel et al.

[11] 4,016,643
[45] Apr. 12, 1977

[54] OVERLAY METALLIZATION FIELD EFFECT TRANSISTOR

[75] Inventors: Robert A. Pucel, Needham; James A. Benjamin, Boxford, both of Mass.

[73] Assignee: Raytheon Company, Lexington, Mass.

[22] Filed: Apr. 12, 1976

[21] Appl. No.: 676,033

Related U.S. Application Data

[62] Division of Ser. No. 518,692, Oct. 29, 1974, abandoned.

[52] U.S. Cl. .................................. 29/571; 29/578; 357/15; 427/84
[51] Int. Cl.[2] .................................. B01J 17/00
[58] Field of Search ................ 29/571, 578, 589; 357/15, 22; 427/84

[56] References Cited

UNITED STATES PATENTS

| | | | |
|---|---|---|---|
| 3,657,615 | 4/1972 | Driver | 357/15 |
| 3,763,408 | 10/1973 | Kano | 357/15 |
| 3,969,745 | 7/1976 | Blocker | 357/22 |

*Primary Examiner*—W. Tupman
*Attorney, Agent, or Firm*—John R. Inge; Joseph D. Pannone; Milton D. Martlett

[57] ABSTRACT

A high-frequency, high-power FET constructed upon a planar substrate with a repeated pattern of gate, source, and drain connections wherein any two are connected with metallization layers adjacent to and separated from the semiconductor substrate. The third element is interconnected with an overlay metallization layer separated from the lower two metallization layers by an insulating dielectric. The overlay layer is preferably grounded for minimum feedback capacitance.

4 Claims, 12 Drawing Figures

OVERLAY METALLIZATION FIELD EFFECT TRANSISTOR

CROSS-REFERENCE TO RELATED APPLICATIONS

This is a division of application Ser. No. 518,692, filed Oct. 29, 1974, now abandoned.

BACKGROUND OF THE INVENTION

1. Field of the Invention

The invention relates to high power field effect transistors having a multiplicity of gate, source, and drain electrodes. More specifically, the invention relates to high power, high frequency Schottky barrier type field effect transistors fabricated by planar technology. Such transistor devices are used to advantage in microwave signal amplifier and radar applications.

2. Description of the Prior Art

A high power, high frequency field effect transistor (FET) device has long been sought for numerous microwave and radar amplification applications. FET's are preferred over bipolar transistors and the various types of negative resistance amplifying diodes because field effect transistors have an inherently lower noise figure than other devices. Moreover, microwave circulators are not required as for amplifying negative resistance diodes. Also, the impedance levels commonly encountered with field effect transistors are often more convenient in amplifier design than impedances of other devices.

Unlike a bipolar transistor an FET is a majority carrier device. As such, the FET does not operate by carrier emission over a thermally sensitive barrier and thus does not depend upon a conduction mechanism which varies exponentially with temperature. Hence, an FET is not susceptible to thermal runaway as is a bipolar transistor. Because of this conduction mechanism, the FET will operate satisfactorily over a larger range of ambient temperatures and will tolerate a higher absolute temperature than a bipolar device. Furthermore, a higher thermal resistance package may be used with the FET than may be used with the bipolar device.

Some early FET's having a multiplicity of source, drain, and gate electrodes or contacts made connection to one of elements through the bulk of the device. Such arrangements typically gave high feedback capacitances between input and output elements. The resistance of the bulk material also frequently became a limiting factor in determining the frequency response of the device. Such devices often could not be entirely fabricated using planar technology.

It soon became evident that it was desirable to make contact to all three sets of electrodes upon the surface of the device. Devices were constructed using a multiplicity of two of the electrodes and a single one of the third electrode. Various geometric configurations were tried for making contact to these electrodes. However, the total potential of the device was never realized using these geometries as device operation was severely limited by the use of only a single one of one of the three electrodes.

SUMMARY OF THE INVENTION

Accordingly, it is an object of the present invention to provide a high power, high frequency field effect transistor device.

Also, it is an object of the present invention to provide a field effect transistor having low feedback capacitance between input and output electrodes.

Moreover, it is an object of the present invention to provide a field effect transistor having a multiplicity of each of the three electrodes therein.

Furthermore, it is an object of the present invention to provide a field effect transistor which may be fabricated entirely by planar techniques.

These, as well as other objects of the invention may be met by the combination of a field effect transistor device or body having a plurality of electrodes therein, including but not limited to a gate, source, and drain, and means for interconnecting contacts of like ones of each of the electrodes wherein a portion of the interconnecting means overlays and is insulated from other portions of the interconnecting means.

More specifically, these as well as other objects may be met by a field effect transistor having a plurality of gate, drain, and source electrodes alternating among one another arranged in substantially linear rows. Contact to two sets of these electrodes is made by metallization layers supported by a dielectric insulating layer overlaying the active portion of the substrate of the device. A second dielectric insulating layer covers the first two layers of metallization. Contact to the third set of electrodes is made through apertures in the second dielectric layer. An overlay layer of metallization completes the contact among the contacts of the third set of electrodes. In circuit operation the electrodes interconnected by the third metallization layer are preferably operated at ground potential to minimize feedback capacitance between input and output electrodes.

Devices constructed in accordance with the teachings of the present invention may be mounted directly as a component of microwave integrated circuits with impedance matching elements included therein. The invention is used to particular advantage in microwave signal relay amplifiers and in phased array radar amplifiers.

DESCRIPTION OF THE PREFERRED EMBODIMENT

Figure 1A:
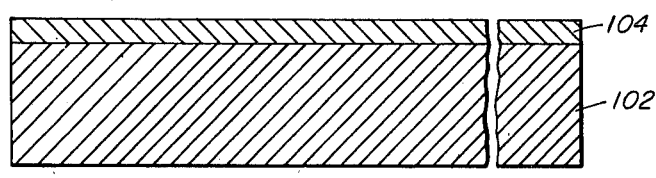
FIGS. 1A–1G are a series of cross sectional views showing a device in accordance with the present invention in various stages of construction.
Figure 1B:
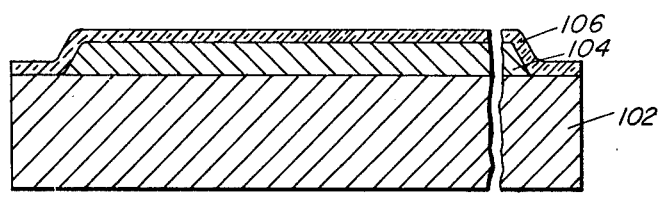
Figure 1C:
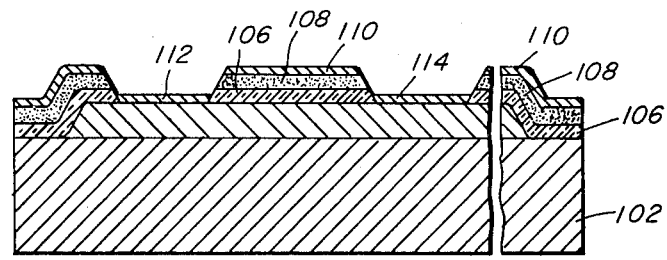
Figure 1D:
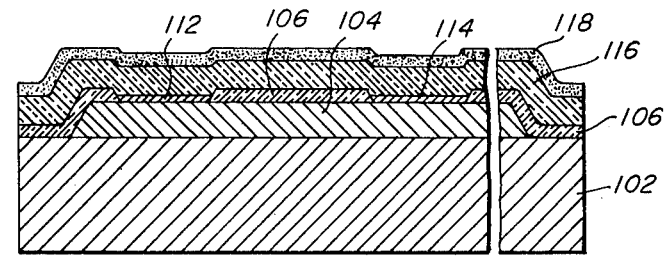
Figure 1E:
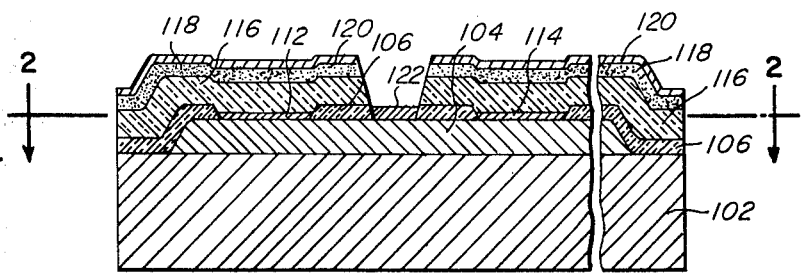
Figure 1F:
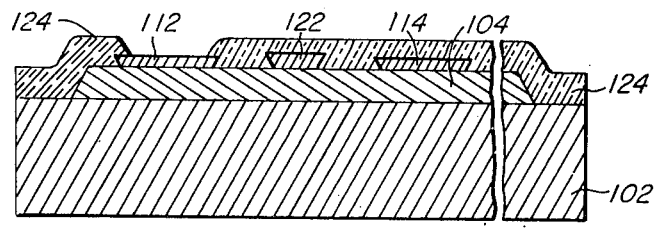
Figure 1G:
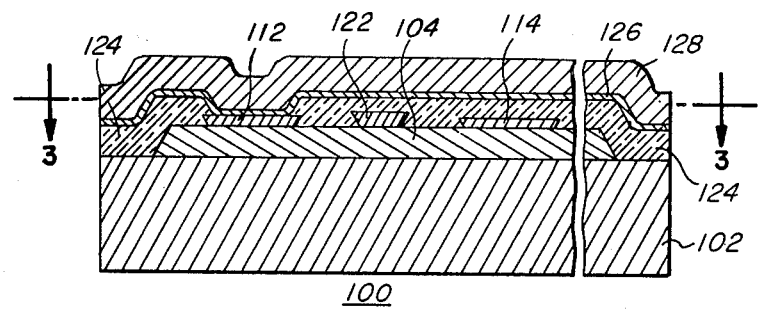
Figure 2:
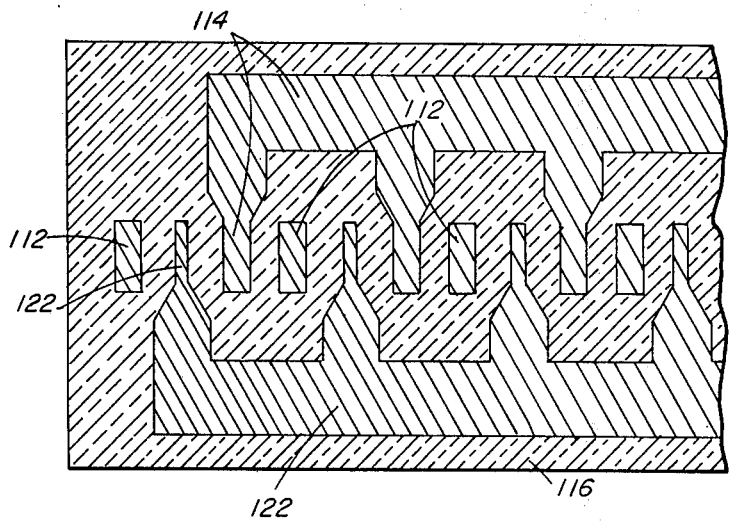
FIG. 2 is a planar-cross sectional view of the device shown in the FIG. 1F.
Figure 3:
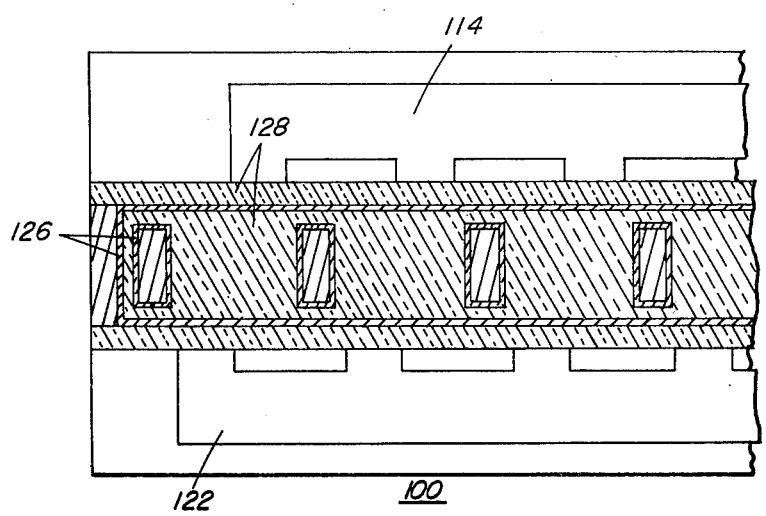
FIG. 3 is a planar-cross sectional view of the device shown in FIG. 1G.

A preferred embodiment of the invention is shown in various stages of construction in FIGS. 1A–1G and FIGS. 2 and 3. FIGS. 1A–1G show for clarity of illustration only one each of the three types of contacts or electrodes although an actual device would have a plurality of each in a repeating pattern. This pattern is shown in FIGS. 2 and 3 which show a larger portion of an entire device.

Referring now in particular to FIGS. 1A–1G, the fabrication of a device in accordance with the teachings of the present invention will be explained. As shown in FIG. 1A, fabrication of the device is begun with a wafer having an epitaxial layer 104 on top of semiconductor body or substrate 102. Substrate 102 is lightly doped and has correspondingly low resistitivity. Gallium arsenide is the preferred semiconductor material although silicon or other semiconductor materials may be used as well. The preferred thickness of substrate 102 is between 10 and 15 mils although a substrate 102 as thin as 5 mils may be used. A chromium dopant is preferred with the material doped to a resistivity level of $10^6$ or $10^8$ or greater $\Omega$-cm. Epitaxial layer 104 has a preferred thickness in the range 0.2 to 0.6 mm and a doping density in the range of $10^{16}$ to $10^{17}$ atoms/cm$^3$.

Next, as shown in FIG. 1B epitaxial layer 104 is etched to a mesa configuration throughout the region where the gate, source, and drain elements are to be fabricated. A layer of glass 106 is then deposited over the entire surface of the device. First glass layer 106 should be approximately 1000 A.

Openings in the shape of the desired metallization patterns and contacts are then etched through first glass layer 106 as in FIG. 1C using photo resistive techniques. To accomplish this step, photoresist layer 108 is deposited over the entire surface of glass layer 106. Photoresist layer 108 is then masked in the regions where the photo resistive material is to remain and the other portions exposed to light. The exposed photo resistive material is developed and chemically dissolved away leaving two rectangular holes therein. A conductive layer is for forming Schottky barrier contacts with gallium arsenide is then deposited using any of a number of available and well known techniques such as sputtering or evaporation. This step forms contacts and metallization layers 112 (source) and 114 (drain) with epitaxial layer 104. A eutectic mixture of gold and germanium or nickel are the materials preferred. The thickness in the preferred embodiment is approximately 1000 A. Reference to FIG. 2 at this point in the construction sequence shows the preferred shape of the metallization patterns of metallization layers 112 and 114. Remaining metal 110 and photoresist layer 108 are then dissolved away.

FIG. 1D shows the next steps in preparation for laying down the third contact to form a gate. Second glass layer 116 is deposited over first glass layer 106 and metallization 112 and 114. Second glass layer 116 is preferably 4000 A in thickness.

The next set of steps shown in FIG. 1E are similar to those performed in the transition from the device shown in 1B to that shown in 1C. Photo resistive layer 118 is deposited atop second glass layer 116, the photo resistive material exposed in a rectangularly shaped area between contacts 112 and 114. The exposed photo resistive material is removed and a hole etched through second glass layer 116 and first glass layer 106 down to the surface of epitaxial layer 104. A layer 120 of Schottky barrier contact forming metal preferably an alloy of chrome and gold is then deposited over the exposed surface forming contact 122. Contact 122 is preferably thicker than contacts 112 and 114. Five thousand angstrom is used in the preferred embodiment. First glass layer 106, second glass layer 116, photo resistive layer 118, and remaining metal layer 120 are dissolved leaving the exposed contacts and metallization layers. FIG. 2 shows a planar-cross-sectional view of the device at this point in the construction sequence.

Then, as shown in FIG. 1F, the remaining exposed surface of the device is coated with third glass layer 124. Using the photo resistive techniques described above an aperture is etched through glass layer 124 above contact 112.

The final metallization steps are then performed as shown in FIG 1G. A thin layer of titanium 126 is first deposited over the surface of the device in the pattern as shown in FIG. 3. A thicker layer of gold 126 is deposited over the layer of titanium 126 in the same pattern as shown in FIG. 3. In the preferred embodiment the widths of contacts 112, 122, and 114 are respectively 15 μm, 1.5 μm, and 10 μm. Other dimensions, shapes, and placement of the contacts may be used as required, the arrangement shown being by way of illustration only. Of course, any one of the gate, source, or drain electrodes can be connected to the overlay metallization layer for use as the common element in a circuit application.

In the preferred circuit operation of devices constructed in accordance with the teachings of the present invention the overlay layer of metallization and the contact elements to which it is coupled are connected to ground. In the particular device illustrated in the foregoing discussion with the source contacts grounded capacitances between metallization layers will only be formed between the source and gate and source and drain electrodes. Very little capacitance will be formed between gate and drain electrodes as these have been shorted to ground by the choice of metallization patterns and grounded contact. Hence, little feedback capacitance between gage and drain electrodes exists between metallization layers. The maximum frequency at which the device produces usable gain is greatly increased with this construction.

Figure 4:
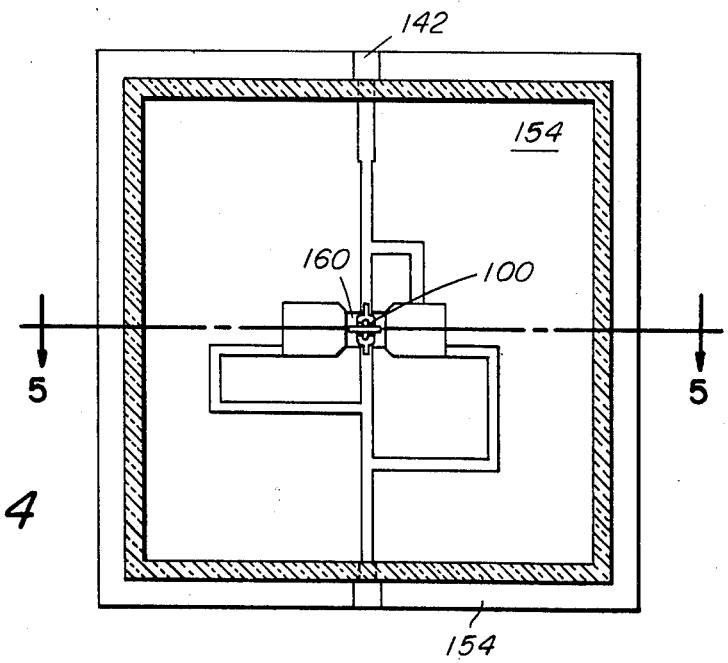
FIG. 4 is a perspective view of a planar package embodying the present invention.
Figure 5:
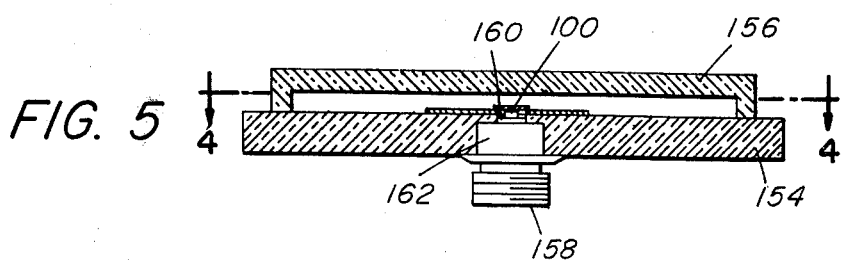
FIG. 5 is a cross sectional rotated view of the device shown in FIG. 4.
Figure 6:
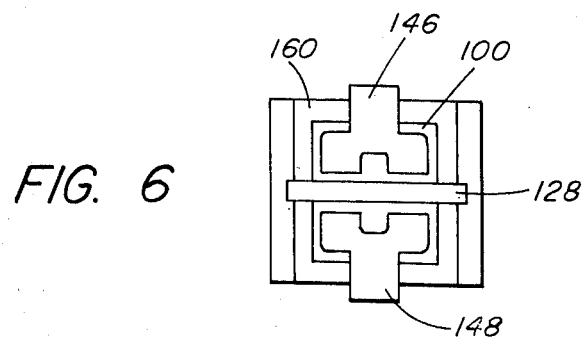
FIG. 6 is a perspective view of a semiconductor device in accordance with the present invention mounted upon a bonding pad adapted for use in the device of FIGS. 4 and 5.

FIGS. 4, 5, and 6 illustrate a semiconductor device in accordance with the present invention mounted in an appropriate package for direct circuit use. The finished semiconductor device 100 is mounted upon gold plated copper bonding pad 160 which is in turn mounted to copper heat sink 162 and screw-in stud 158. Ceramic substrate 154 is fitted around copper heat sink 156. Metallization patterns are deposited on the surface of substrate 154 to connect the semiconductor device to an external circuit. The shapes of the metallization patterns are chosen by microwave integrated circuit technique to match the impedance of the semiconductor device to that of the circuit in which it is being used. The linear dimensions of the various legs of the metallization patterns are chosen in accordance with the frequency at which the device is to be operated. Drain contact 146, coupled upon the device to the drain metallization layer 114 is coupled through drain metallization pattern 144 to drain connector 142. Similarly, gate contact 148, coupled to gate metallization layer 122, is coupled through gate metallization pattern 150 to gate connector 152. Source metallization 128 is connected to ground through bonding pad 160, copper heat sink 156, and screw-in stud 158. Ceramic lid 156 is hermetically sealed to ceramic substrate 154 to complete construction of the package.

Although preferred embodiments of the invention have been described numerous modifications and alterations thereto would be apparent to one having ordinary skill in the art without departing from the spirit and scope of the present invention.

It is claimed that:

1. The method comprising the steps of:
providing a substrate of semiconductor material;
growing an epitaxial layer on said substrate;
covering said epitaxial layer with a first insulating layer;
removing portions of said first insulating layer from said epitaxial layer in first and second predetermined patterns;
depositing first and second metal layers in said first and second predetermined patterns;
covering said first and second metal layers and said first insulating layers with a second insulating layer;
removing portions of said second insulating layer and said first insulating layer from regions interspersed between portions of said first and second metal layers;
depositing a third metal layer upon said epitaxial layer in said interspersed regions; to form Schottky barrier contacts
removing the remaining portions of said first and second insulating layers;
covering portions of said first, second, and third metal layers with a third insulating layer;
removing portions of said third insulating layer above a predetermined one of said first, second and third metal layers; and
depositing a fourth metal layer, said fourth metal layer being patterned to interconnect portions of said predetermined one of said first, second, and third metal layers.

2. The method of claim 1 wherein at least two of said first, second, and third metal layers comprise an alloy of gold and germanium.

3. The method of claim 2 wherein said first, second, and third insulating layers comprise silicon dioxide.

4. The method of claim 3 wherein said depositing said fourth metal layer comprises the steps of:
depositing a layer of titanium; and
depositing a layer of gold.

* * * * *

UNITED STATES PATENT OFFICE
CERTIFICATE OF CORRECTION

Patent No. 4,016,643   Dated   April 12, 1977

Inventor(s)   Robert A. Pucel and James A. Benjamin

It is certified that error appears in the above-identified patent and that said Letters Patent are hereby corrected as shown below:

Abstract, line 4, delete "connected" and insert therefor -- interconnected --;

Signed and Sealed this ninth Day of August 1977

[SEAL]

Attest:

RUTH C. MASON
Attesting Officer

C. MARSHALL DANN
Commissioner of Patents and Trademarks